(12) United States Patent
Hu

(10) Patent No.: US 10,475,928 B2
(45) Date of Patent: Nov. 12, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jian Qiang Hu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/985,191

(22) Filed: May 21, 2018

(65) Prior Publication Data

US 2018/0342607 A1 Nov. 29, 2018

(30) Foreign Application Priority Data

May 24, 2017 (CN) .......................... 2017 1 0372717

(51) Int. Cl.
| | |
|---|---|
| H01L 21/00 | (2006.01) |
| H01L 29/78 | (2006.01) |
| H01L 21/02 | (2006.01) |
| H01L 29/66 | (2006.01) |
| H01L 27/115 | (2017.01) |
| H01L 21/762 | (2006.01) |
| H01L 27/11531 | (2017.01) |
| H01L 27/11573 | (2017.01) |

(52) U.S. Cl.
CPC ...... H01L 29/785 (2013.01); H01L 21/02236 (2013.01); H01L 21/02255 (2013.01); H01L 21/02274 (2013.01); H01L 21/76202 (2013.01); H01L 21/76229 (2013.01); H01L 21/76232 (2013.01); H01L 27/115 (2013.01); H01L 29/66795 (2013.01); H01L 27/11531 (2013.01); H01L 27/11573 (2013.01)

(58) Field of Classification Search
None
See application file for complete search history.

(56) References Cited

U.S. PATENT DOCUMENTS

2016/0218180 A1* 7/2016 You .................... H01L 29/6681

* cited by examiner

*Primary Examiner* — Reema Patel
(74) *Attorney, Agent, or Firm* — Anova Law Group, PLLC

(57) ABSTRACT

Semiconductor structures and fabrication methods thereof are provided. An exemplary fabrication process includes providing a semiconductor substrate having a first region and a second region and having a plurality of first fins in the first region and a plurality of second fins in the second region; performing a first oxidation process on the first fins to form a first oxide layer on surfaces of the first fins and to cause corners between top surfaces and side surface of the first fins to form first rounded corners; and performing a second oxidation process on the second fins to form a second oxide layer on surfaces of the second fins and to cause corners between top surfaces and side surface of the second fins to form second rounded corners. A radius of curvature of the first rounded corner is different from a radius of curvature of the second rounded corner.

20 Claims, 4 Drawing Sheets

SEMICONDUCTOR STRUCTURE AND FABRICATION METHOD THEREOF

CROSS-REFERENCES TO RELATED APPLICATIONS

This application claims the priority of Chinese patent application No. 201710372717.2, filed on May 24, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods thereof.

BACKGROUND

With the continuous development of semiconductor technologies, semiconductor devices have been developed toward high integration level with high quality. The critical dimension (CD) of the semiconductor devices has been correspondingly reduced. Reducing the critical dimension of the semiconductor devices allows more transistors to be formed on one chip. Accordingly, the performance of the semiconductor devices is improved.

In the field of memory devices, with the development of information technologies, the amount of the information have been continuously increased. Accordingly, higher requirements for the capacity of the memory devices have been brought out. A memory device often includes a storage region and a peripheral region. The storage region is used to form memory cells; and the memory cells are used to store data. The peripheral region is used to form the peripheral circuits of the memory device. With the continuous shrinking of the sizes of the memory transistors, forming more transistors in the storage region has the great advantage to increase the amount of information stored in the memory device. The memory device has different requirements for the properties of the transistors in the storage region and the transistors in the peripheral region. Thus, the structures of the transistors in the storage region and the structures of the transistors in the peripheral region are different.

With the continuous shrinking of the sizes of the transistors in the storage region, the differences between the structures of the transistors in the storage region and the structures of the transistors in the peripheral region have become more obvious.

The transistors in the storage region and the transistors in the peripheral region can be fin field-effect transistors (FinFETs). During the process for forming the FinFETs, to reduce the electric field at the corners between the top surfaces and the side surfaces of the fins of the FinFETs, and to prevent the gate dielectric layer at the corner from being broken-down, an oxidation process is often performed on the fins to increase the radius of curvature of the fins. The requirements of the oxidation process on the storage region of the devices and the requirements of the oxidation process on the peripheral region of the devices are different.

However, it is difficult to match the difference between the requirements of the oxidation process on the storage region and the requirements of the oxidation process on the peripheral region. Thus, the performance of the semiconductor structure having the memory device is not as desired. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate having a first region and a second region, and having a plurality of first fins in the first region and a plurality of second fins in the second region; performing a first oxidation process on the first fins to form a first oxide layer on surfaces of the first fins and to cause corners between top surfaces and side surface of the first fins to form first rounded corners; and performing a second oxidation process on the second fins to form a second oxide layer on surfaces of the second fins and to cause corners between top surfaces and side surfaces of the second fins to form second rounded corners. A radius of curvature of the first rounded corners is different from a radius of curvature of the second rounded corners.

Another aspect of the present disclosure includes a semiconductor structure. The semiconductor structure includes providing a semiconductor substrate having a first region and a second region and having a plurality of first fins in the first region and a plurality of second fins in the second region; performing a first oxidation process on the plurality of first fins to form a first oxide layer on surfaces of the plurality of first fins, and performing a second oxidation process on the plurality of second fins to form a second oxide layer on surfaces of the plurality of second fins. Corners between top surfaces and side surfaces of the plurality of first fins form first rounded corners; corners between top surfaces and side surfaces of the second fins form second rounded corners; and a radius of curvature of the first rounded corner is different from a radius of curvature of the second rounded corner.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
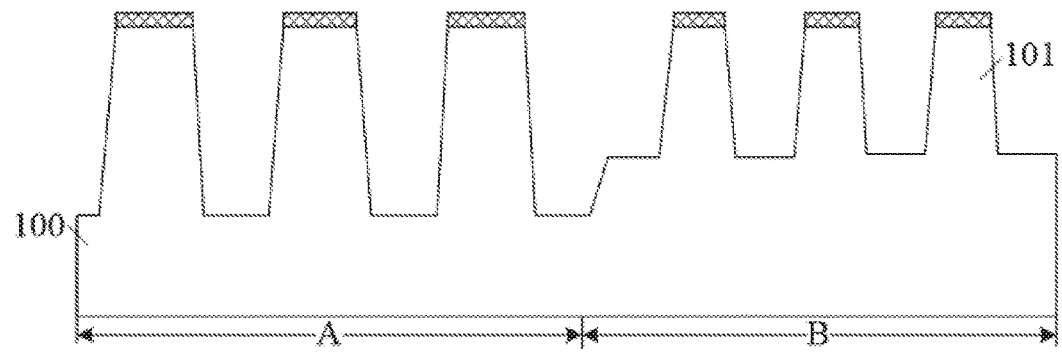
FIGS. 1-2 illustrate structures corresponding to certain stages during a process for forming a semiconductor structure.
Figure 2:
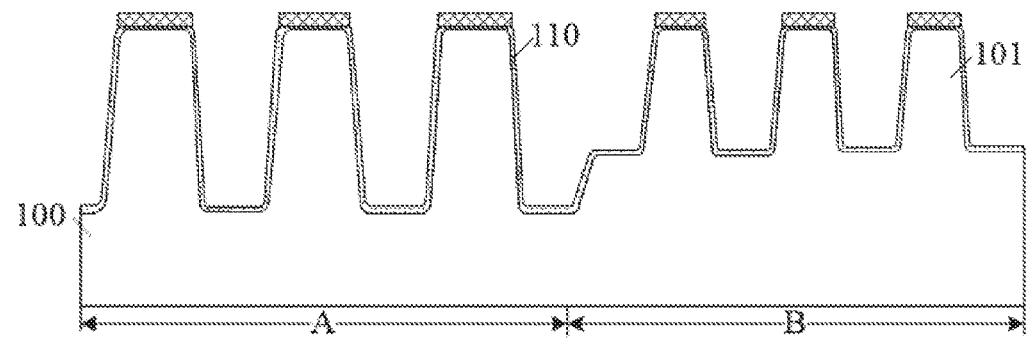

FIGS. 1-2 illustrate structures corresponding to certain stages during a process for forming a semiconductor structure.

As shown in FIG. 1, the fabrication process includes providing a semiconductor substrate 100. The semiconductor substrate 100 has a peripheral region "A" and a storage region "B". A plurality of fins 101 are formed on the semiconductor substrate 100 in the peripheral region "A" and the storage region "B".

Further, as shown in FIG. 2, the fabrication process also includes performing an oxidation process on the fins 101 to form an oxide layer 110 on the surface of the fins 101.

The top surfaces of the fins 101 and the side surfaces of the fins 101 may have rounded corners. The oxidation process is able to increase the radius of curvature of the rounded corners; and the electric field at the corners may be reduced; and the break-down of the gate dielectric layer on the surfaces of the corners is prevented.

A gate dielectric layer is subsequently formed on the fins 101. The gate dielectric layer is across the fins 101 by covering the top and side surfaces of the fins 101. Further, a gate electrode layer is formed on the gate dielectric layer.

The devices in the peripheral region "A" may be used to control and select the memory cells in the storage region "B". To increase the reliability of the semiconductor structure, a relatively high capacitance is required between the gate structure and the fins 101 in the peripheral region "A". Thus, the thickness of the gate dielectric layer in the peripheral region "A" may be relatively small. To prevent the gate dielectric layer in the peripheral region "A" from being broken-down, the radius of curvature of the corners in the peripheral region "A" should not be too small. That is, the thickness of the oxide layer 110 should be relatively large. However, to increase the amount of the information stored in the memory cells in the storage region "B", the widths of the fins 101 in the peripheral region "B" and the distance between the adjacent fins 101 in the peripheral region "B" are relatively small. If the thickness of the oxide layer 110 is too large, the thickness of the oxidized portions of the fins 101 is relatively large. Thus, the width of the channels of the transistors in the memory device is too small. Accordingly, the performance of the transistors in the storage region "B" is adversely affected.

The fins 101 in the storage region "B" and the fins 101 in the peripheral region "A" are oxidized simultaneously to form the oxide layer 110. Thus, the oxidation scale of the peripheral "A" and the oxidation scale of the storage region "B" are substantially same. Therefore, it is difficult to ensure the performance of the storage region "B" and the performance of the storage region "A" simultaneously.

The present disclosure provides a semiconductor structure and a fabrication method for the semiconductor structure. The fabrication method may include performing a first oxidation process on the fins in the first region to cause the corners between the side surfaces and the top surfaces of the fins in the first region to be first rounded corners; and performing a second oxidation process on the fins in the second region to cause the corners between the side surfaces and the top surfaces of the fins in the second region to be second rounded corners. The radius of curvature of the first rounded corners may be different from the radius of curvature of the second rounded corners.

Because the radius of curvature of the first rounded corners may be different from the radius of curvature of the second rounded corners, the requirements of transistors for the fins in the first region and the requirements of transistors for fins in the second region may be satisfied simultaneously.

Figure 9:
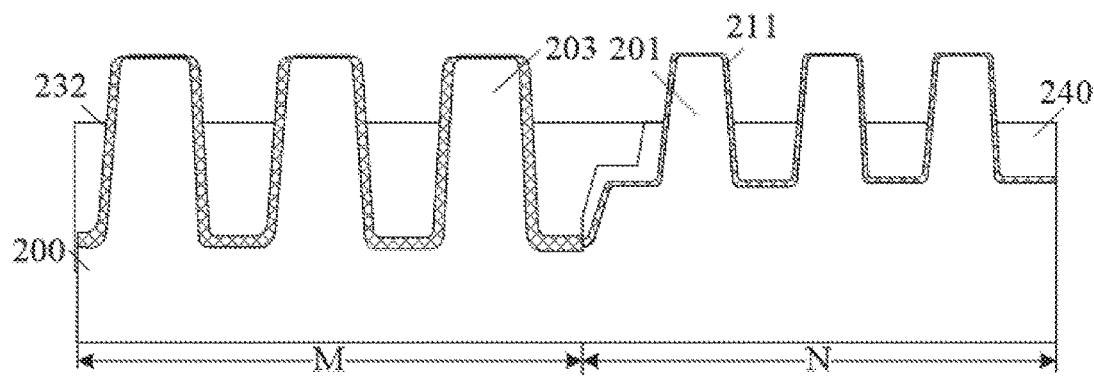
Figure 10:
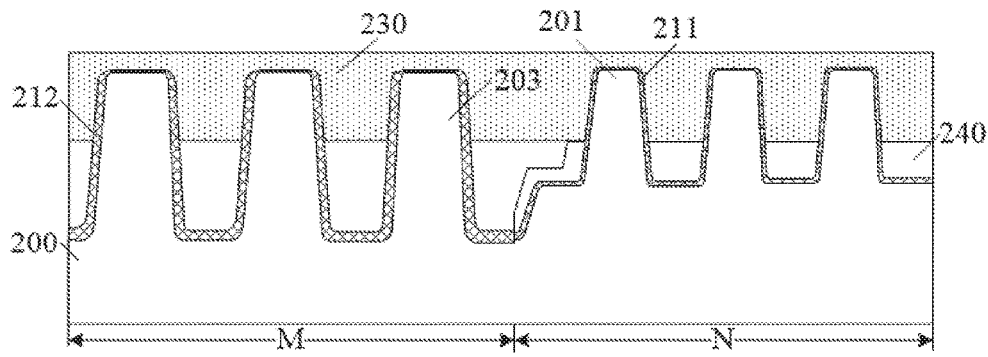
Figure 11:
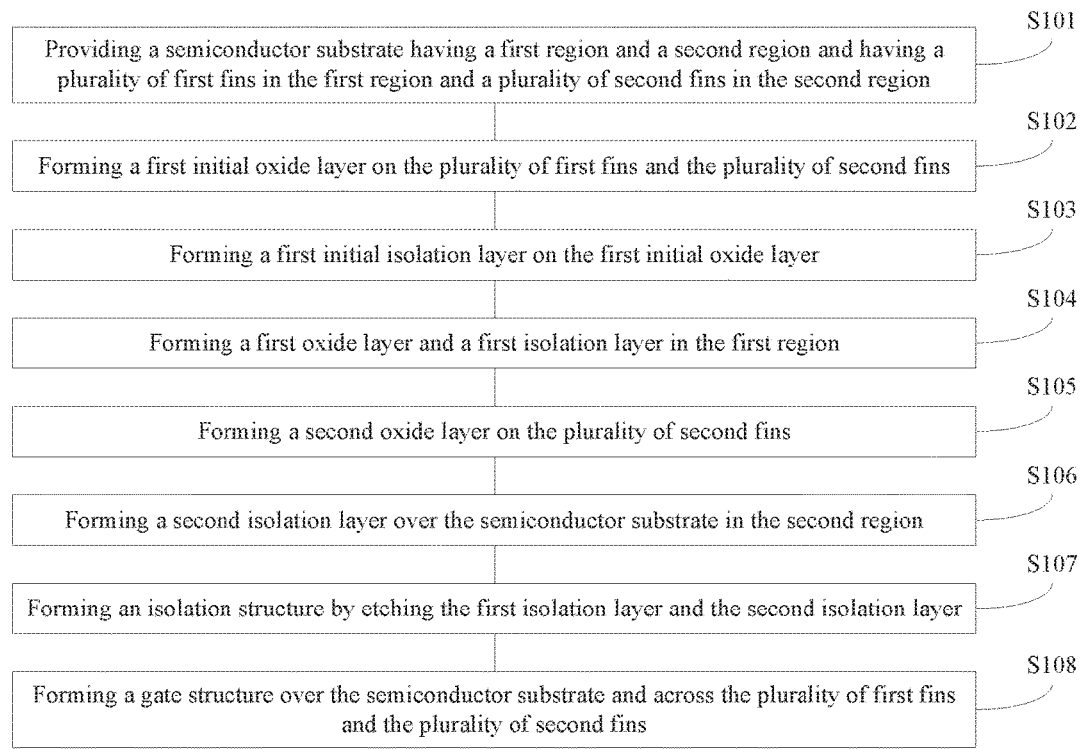
FIG. 11 illustrates an exemplary fabrication process of a semiconductor structure consistent with various disclosed embodiments

FIG. 11 illustrates an exemplary fabrication process of a semiconductor structure consistent with various disclosed embodiments. FIGS. 3-10 illustrate structures corresponding to certain stages during the fabrication process.

Figure 3:
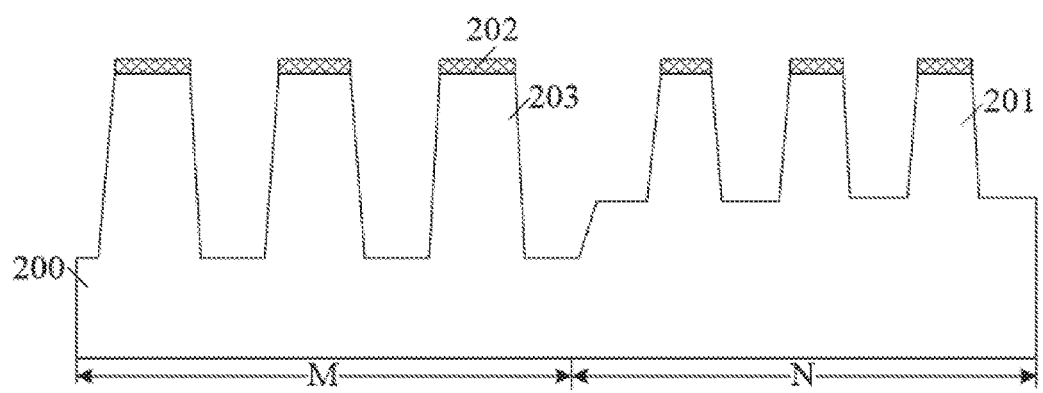
FIGS. 3-10 illustrate structures corresponding to certain stages during an exemplary fabrication process of a semiconductor structure consistent with various disclosed embodiments.

As shown in FIG. 11, at the beginning of the fabrication process, a semiconductor substrate with certain structures is provided (S101). FIG. 3 illustrates a corresponding semiconductor structure.

As shown in FIG. 3, a semiconductor substrate 200 is provided. The semiconductor substrate 200 may include a first region "N" and a second region "M". A plurality of fins may be formed on the semiconductor substrate 200 in the first region "N" and the second region "M". The fins in the first region "N" may be referred to as first fins 201. The fins in the second region "M" may be referred to as second fins 203.

The side surfaces and the top surfaces of the fins may form corners.

In one embodiment, the semiconductor substrate 200 is used to form a memory. The first region "N" may be used to subsequently form memory devices of the memory; and the second region "M" may be used to subsequently form the peripheral circuits of the memory.

To increase the storage capacity of the memory, the sizes of the transistors formed in the first region "N" may be substantially small. For example, the width of the first fins 201 and the distances between adjacent first fins 201 may be substantially small. The peripheral circuits of the memory may be used to select and control the memory cells. The sizes of the transistors in the second region "M" may be relatively large. For example, the width of the second fins 203 in the second region "M" may be greater than the width of the first fins 201 in the first region "N"; and the distance between the adjacent second fins 203 in the second region "M" may be greater than the distance between the adjacent first fins 201 in the first region "N".

The width of the fins may be refer to as the size of the fins along a direction perpendicular to the length direction of the fins and a direction parallel to a surface of the semiconductor substrate 200.

If the width of the first fins 201 in the first region "N" and/or the distance between the adjacent first fins 201 in the first region "N" is too large, the integration level of the memory may be reduced; and the storage capacity of the memory may be reduced. If the width of the first fins 201 in the first region "N" and/or the distance between the adjacent first fins 201 in the first region "N" is too small, the process difficulty may be increased. Thus, in one embodiment, the widths of the first fins 201 in the first region "N" may be in a range of approximately 0.05 µm-0.07 µm, such as 0.06 µm. The distance between the adjacent first fins 201 in the first region "N" may be in a range of approximately 0.05 µm-0.07 µm, such as 0.056 µm.

If the width of the second fins 203 in the second region "M" and/or the distance between the adjacent second fins 203 in the second region "M" is too large, the integration level of the memory may be reduced. If the width of the second fins 203 in the second region "M" and/or the distance between the adjacent second fins 203 in the second region "M" is too small, the performance of the transistors subsequently formed in the second region "M" may be affected. Thus, in one embodiment, the widths of the second fins 203 in the second region "M" may be equal to, or greater than approximately 0.3 µm. The distance between the adjacent second fins 203 in the second region "M" may be equal to, or greater than 0.3 µm.

In one embodiment, the semiconductor substrate 200 and the fins, including the first fins 201 and the second fins 203, are made of silicon. In some embodiments, the semiconductor substrate and the fins may be made of germanium, silicon germanium, or other appropriate semiconductor material.

In one embodiment, a process for forming the semiconductor substrate 200 and the fins may include providing an initial substrate having the first region "N" and the second region "M"; forming a patterned mask layer 202 on the initial substrate in the first region "N" and the second region "M"; and etching the initial substrate using the mask layer 202 as an etching mask to form the first fins 201 on the semiconductor substrate 200 in the first region "N", and the second fins 201 on the semiconductor substrate 200 in the second region "M".

The mask layer 202 may be made of any appropriate material. In one embodiment, the mask layer 202 is made of silicon nitride, or silico oxynitride.

A first oxidation process may be subsequently performed on the first fins 201 in the first region "N" to form a first oxide layer on the first fins 201 in the first region "N" and to cause the corners between the top surfaces and the side surfaces of the first fins 201 in the first region "N" to become first rounded corners. A second oxidation process may be subsequently performed on the second fins 203 in the second region "M" to form a second oxide layer on the second fins 203 in the second region "M" and to cause the corners between the top surfaces and the side surfaces of the second fins 203 in the second region "M" to become second rounded corners. The radius of curvature of the first rounded corners of the first fins 201 in the first region "N" may be controlled by the first oxidation process. Thus, the first fins 201 in the first region "N" may match the requirements for the transistors in the first region "N".

Figure 4:
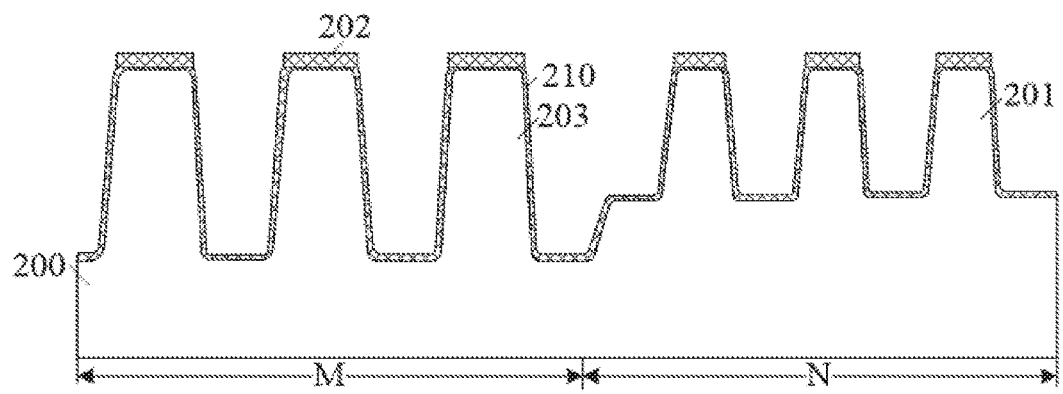

Returning to FIG. 11, after providing the semiconductor substrate with the certain structures, a first initial oxide layer may be formed (S102). FIG. 4 illustrates a corresponding semiconductor structure.

As shown in FIG. 4, a first initial oxide layer 210 is formed on the first fins 201 in the first region "N" and the second fins 203 in the second region "N". The first initial oxide layer 210 may be formed by performing a first oxidation process on the first fins 201 in the first region "N" and the second fins 203 in the second region "M".

The first oxidation process may be used to reduce the radius of curvature of the fins to reduce the tip-charging effect on the corners of the fins. Accordingly, the electric field at the corners of the fins may be reduced; and the breakdown of the subsequently formed gate dielectric layer on the corners of the fins may be prevented.

In one embodiment, referring to FIG. 4, the mask layer 202 may be formed on the fins. The masks layer 202 may protect the top surfaces of the fins during the first oxidation process. Thus, the oxidation of the top surface of the fins may be reduced. Thus, in one embodiment, the first initial oxide layer 210 may only cover the side surfaces of the fins. In some embodiments, the mask layer may not be on the top surfaces of the fins. Thus, the first initial oxide layer may cover the side surfaces and the top surfaces of the fins.

The reaction gas of the first oxidation process may include oxygen. The flow rate of the reaction gas may be in a range of approximately 0.05 L/min-0.5 L/min. The oxidation time may be in a range of approximately 2 hours-8 hours.

If the oxidation time is too long, the material of the fins 201 in the first region "N" may be oxidized too much; and the width of the first fins 201 after the first oxidation process may be too small; and the performance of the finally formed memory cells may be adversely affected. If the oxidation time is too short, the increase of the radius of curvature of the first fins 201 in the first region "N" may be insufficient.

Accordingly, the electric field at the corners of the first fins 201 in the first region "N" may be not be sufficiently weakened.

The thickness of the first initial oxide layer 210 may be any appropriate value. If the thickness of the first initial oxide layer 210 is too large, the width of the first fins 201 in the first region "N" after the first oxidation process may be too small; and the performance of the formed memory cells may be affected. If the thickness of the first initial oxide layer 210 is too small, the increase of the radius of curvature of the first fins 201 in the first region "N" may be insufficient. Accordingly, the electric field at the corners of the first fins 201 in the first region "N" may be insufficiently weakened. In one embodiment, the thickness of the first initial oxide layer 210 may be in a range of approximately 45 Å-55 Å.

Figure 5:
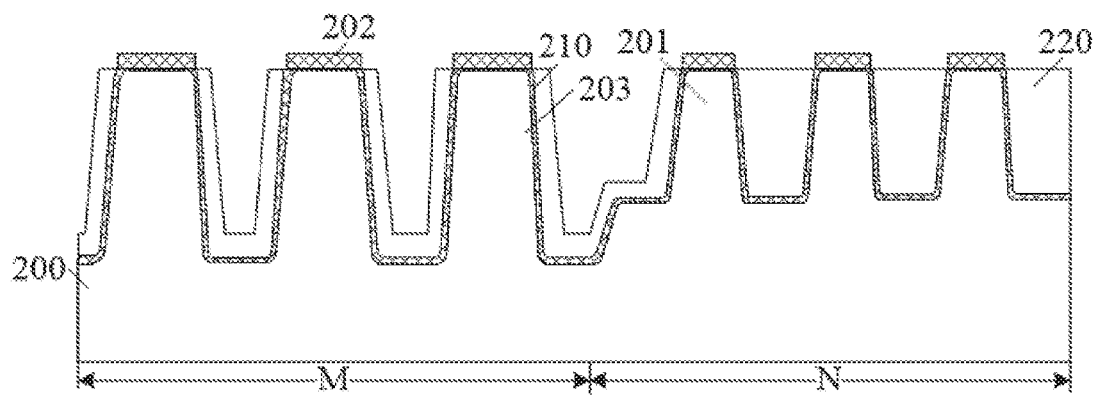

Returning to FIG. 11, after forming the first initial oxide layer, a first initial isolation layer may be formed (S103). FIG. 5 illustrates a corresponding semiconductor structure.

As shown in FIG. 5, a first initial isolation layer 220 is formed on the side surfaces of the first fins 201 in the first region "N" and the side surfaces of the second fins 203 in the second region "M". In one embodiment, the first initial oxide layer 210 cover the surfaces of the first fins 201 in the first region 'N' and the second fins 203 in the second region "M". Thus, the first initial isolation layer 220 may be formed on the first initial oxide layer 210. The first initial isolation layer 220 may be used to subsequently form a first isolation layer to prevent the first fins 201 in the first region "N" from being further oxidized during a subsequent second oxidation process.

In one embodiment, the first initial isolation layer 220 may be made of silicon oxide. In some embodiments, the first initial isolation layer may also be made of silicon oxynitride, etc.

In one embodiment, the first initial isolation layer 220 may fill the gaps between adjacent first fins 201.

Various processes may be used to form the first initial isolation layer 220. In one embodiment, the first initial isolation layer 220 is a flowable chemical vapor deposition (FCVD) process. The first initial isolation layer 220 formed by the FCVD process may have an acceptable gap filling performance; and may be able to sufficiently fill the gaps between the adjacent first fins 201. In some embodiments, the first initial isolation layer may be formed by a plasma enhanced chemical vapor deposition (PECVD) process.

The thickness of the first initial isolation layer 220 may determine the thickness of the subsequently formed first isolation layer. If the thickness of the first initial isolation layer 220 is too small, the thickness of the first isolation layer may be too small; and the first isolation layer may be unable to sufficiently protect the first fins 201 in the first region "N" during the subsequent second oxidation process. If the thickness of the first initial isolation layer 220 is too small, the process difficulty may be increased. Thus, in one embodiment, the thickness of the first initial isolation layer 220 may be in a range of approximately 1000 Å-2500 Å.

Figure 6:
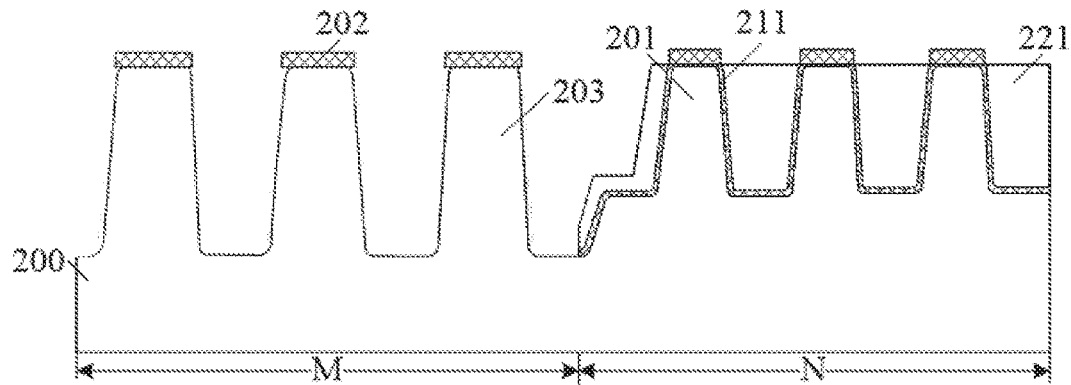

Returning to FIG. 11, after forming the first initial isolation layer, a first oxide layer and a first isolation layer may be formed (S104). FIG. 6 illustrates a corresponding semiconductor structure.

As shown in FIG. 6, a first isolation layer 221 is formed in the first region "N" by removing the portion of the first initial isolation layer 220 in the second region "M". A first oxide layer 211 is formed in the first region "N"; and the portion of the first initial oxide layer 210 in the second region "M" is removed.

The first isolation layer 221 may be used to subsequently form an insolation structure in the first region "N". The first oxide layer 211 may be used to reduce the electric field at the corners of the first fins 201 in the first region "N" to prevent the subsequently formed gate dielectric layer from being broken-down.

In one embodiment, a process for removing the portion of the first initial isolation layer 220 and the first initial oxide layer 210 may include forming a patterned photoresist layer covering the first initial isolation layer 220 in the first region "N"; and etching to remove the portion of the first initial isolation layer 220 in the second region "M" and the portion of the first initial oxide layer 210 in the second region "M".

The portion of the first initial isolation layer 220 in the second region "M" and the portion of the first initial oxide layer 210 in the second region "M" may be removed by any appropriate process, such as a dry etching process, and/or a wet etching process.

Figure 7:
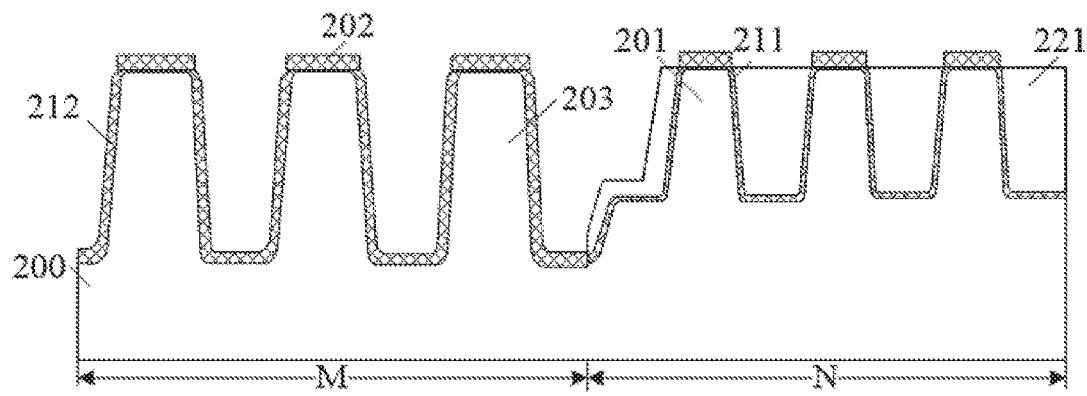

Returning to FIG. 11, after forming the first oxide layer and the first isolation layer, a second oxide layer may be formed (S105). FIG. 7 illustrates a corresponding semiconductor structure.

As shown in FIG. 7, a second oxide layer 212 is formed on the second fins 203 in the second region "M". The second oxide layer 212 may be formed by performing a second oxidation process. After forming the second oxide layer 212, the corners between the top surfaces and the side surfaces of the second fins 203 may become second rounded corners. The radius of curvature of the second rounded corners may be different from the radius of curvature of the first rounded corners.

The second oxidation process may be used to increase the radius of curvature of the corners of the second fins 203 in the second region "M". Thus, the electric field at the corners of the fins 203 in the second region "M" may be reduced; and the break-down in the subsequently formed gate dielectric layer may be prevented.

The radius of curvature of the second rounded corners of the second fins 203 in the second region "M" may be controlled by the second oxidation process. Thus, the second fins 203 in the second region "M" may match the requirements of the performance of the transistors formed in the second region "M". Accordingly, the requirements of the transistors for the radius of curvature in the first region "N" and the requirements of the transistors for the radius of curvature in the second region "M" may be matched simultaneously.

In one embodiment, after forming the first isolation layer 221, the second oxidation process may be performed. In some embodiments, the second oxidation process may be performed before forming the first isolation layer.

During the second oxidation process, the first isolation layer 221 may be able to protect the first fins 201 in the first region "N" from being further oxidized. Thus, the width of the first fins 201 in the first region "N" may not be reduced; and the performance of the semiconductor structure may be improved.

In one embodiment, the reaction gas of the second oxidation process may include $O_2$. The flow rate of the second oxidation process may be in a range of approximately 0.05 L/min-0.5 L/min. The oxidation time may be in a range of approximately 2 hours-8 hours.

If the oxidation time of the second oxidation process is too long, the material of the second fins 203 in the second region "M" may be oxidized too much; and the width of the second fins 203 after the second oxidation process may be too small; and the performance of the finally formed transistors may be adversely affected. If the oxidation time of the second oxidation process is too short, the increase of the radius of curvature of the second fins 203 in the second region "M" may be insufficient. Accordingly, the electric field at the corners of the second fins 203 in the second region "M" may not be sufficiently weakened.

The thickness of the second oxide layer 212 may be any appropriate value. If the thickness of the second oxide layer 212 is too large, the width of the second fins 203 in the second region "M" after the second oxidation process may be too small; and the performance of the formed transistors may be affected. If the thickness of the second oxide layer 212 is too small, the increase of the radius of curvature of the second fins 203 in the second region "M" may be insufficient. Accordingly, the electric field at the corners of the second fins 203 in the second region "N" may not be sufficiently weakened; and the gate oxide layer subsequently formed on the second rounded corner may be broken-down. In one embodiment, the total thickness of the second oxide layer 211 an the first oxide layer 212 may be in a range of approximately 120 Å-170 Å. Specifically, when the thickness of the first oxide layer 211 is approximately 50 Å, the thickness of the second oxide layer 212 may be approximately 50 Å, 75 Å, or 100 Å.

Figure 8:
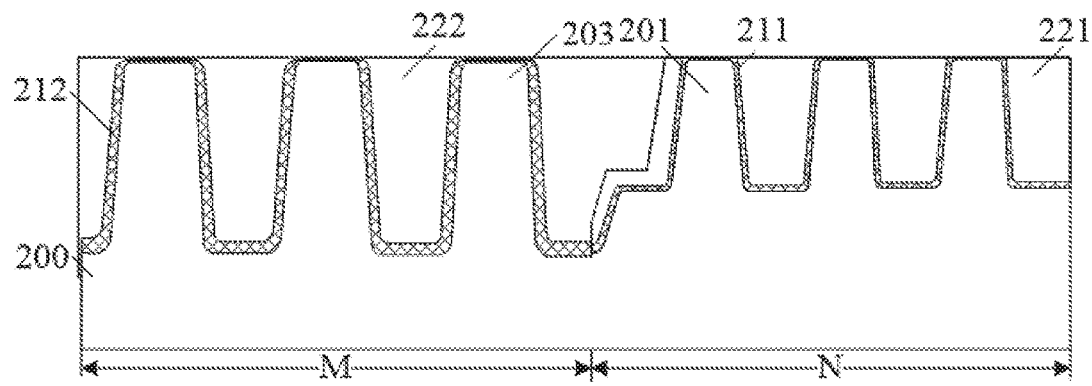

Returning to FIG. 11, after forming the second oxide layer, a second isolation layer may be formed (S106). FIG. 8 illustrates a corresponding semiconductor structure.

As shown in FIG. 8, a second isolation layer 222 is formed on the semiconductor substrate 200 in the second region "M". The second isolation layer 222 may be used to subsequently form an isolation structure in the second region "M".

In one embodiment, the second isolation layer 222 is made of silicon oxide. In some embodiments, the second isolation layer may be made of silicon oxynitride, etc.

In one embodiment, the process for forming the second isolation layer 222 may include formed a second initial isolation layer on the semiconductor substrate 200 in the second region "M" and the first isolation layer 221; and performing a planarization process on the second initial isolation layer to remove the portion of the second initial isolation layer in the second region "M". Thus, the second isolation layer 221 may be formed.

In one embodiment, the second initial isolation layer is formed by a high-density PECVD process. The second initial isolation layer formed by the high-density PECVD process may have a desired compactness; and the insulation properties of the subsequently formed isolation structure may be enhanced. In some embodiments, the second initial isolation layer may be formed by a CVD process, etc.

In one embodiment, the mask layer 202 may be used as the stop layer for the planarization process after the second initial isolation layer. After the planarization process, referring to FIG. 8, the mask layer 202 may be removed.

Returning to FIG. 11, after forming the second isolation layer, an isolation structure may be formed (S107). FIG. 9 illustrates a corresponding semiconductor structure.

As shown in FIG. 9, an isolation structure 240 is formed over the semiconductor substrate 200 and between adjacent fins. The top surface of the isolation structure 240 may be below the top surfaces of the fins. The isolation structure 240 may be formed by removing a partial thickness of the first isolation layer 221 and a partial thickness of the second isolation layer 222.

The isolation structure 240 may be used to electrically insulate adjacent fins from each other.

Various processes may be used to remove the partial thickness of the first isolation layer 221 and the partial thickness of the second isolation layer 222, such as a dry etching process, and/or a wet etching process.

In one embodiment, after forming the isolation structure 240, the first oxide layer 211 and the second oxide layer 212 may not be etched. In some embodiments, after forming the isolation structure, and before subsequently forming a gate structure, the portions of the first oxide layer and the portions of the second oxide layer exposed by the isolation structure may be removed.

Returning to FIG. 11, after forming the isolation structure, a gate structure may be formed (S108). FIG. 10 illustrates a corresponding semiconductor structure.

As shown in FIG. 10, a gate structure 230 is formed. The gate structure 230 may be across the first fins 201 in the first region "N" and the second fins 203 in the second region "M" by covering portions of the side surfaces and the top surfaces of the first fins 201 and the second fins 203.

The gate structure 230 may include a gate dielectric layer across the first region "N" and the second region "M" and covering the portions of the side surfaces and the top surfaces of the fins 201; and a gate electrode layer on the gate dielectric layer.

To increase the reliability of the transistors formed in the second region "M", the thickness of the gate dielectric layer in the second region "M" may be relatively small; and the thickness of the gate dielectric layer in the second region "M" may be smaller than the thickness of the gate dielectric layer in the first region "N". For example, the gate dielectric layer may include a first gate dielectric layer in the first region "N" and a second gate dielectric layer in the second region "M". Because the radius of curvature of the corners of the second fins 203 in the second region "M" may be relatively large, and the thickness of the second oxide layer 212 may be relatively large, the electric field at the second gate dielectric layer at the corners of the second fins 203 in the second region "M" may be relatively small. Accordingly, the second gate dielectric layer in the second region "M" may be uneasy to break down; and the performance of the semiconductor structure may be improved.

For illustrative purposes, a memory structure is described. In some embodiments, the disclosed methods may also be used to form other semiconductor structures which have different requirements for the radii of curvatures of fins in different regions.

The present disclosure also provides a semiconductor structure. An exemplary semiconductor structure is illustrated in FIG. 10.

As shown in FIG. 10, the semiconductor structure may include a semiconductor substrate 200 having a first region "N" and a second region "M"; and a plurality of first fins 201 on the semiconductor substrate 200 in the first region "N" and a plurality of second fins 203 on the semiconductor substrate 200 in the second region "M". The semiconductor structure may also include first oxide layer 211 on the surfaces of the first fins 201 in the first region "N"; and a second oxide layer 212 on the second fins 203 in the second region "M".

In one embodiment, the width of the first fins 201 in the first region "N" may be smaller than the width of the second fins 203 in the second region "M".

In one embodiment, the thickness of the second oxide layer 212 may be different from the thickness of the first oxide layer 211. For example, the thickness of the first oxide layer 211 may be smaller than the thickness of the second oxide layer 212.

Further, the semiconductor structure may include an isolation structure 240 over the semiconductor substrate 200 in the first region "N" and the second region "M"; and a gate structure 230 across the first fins 201 in the first region "N" and the second fins 203 in the second region "N". The gate structure 230 may cover portions of the side surfaces and the top surfaces of the first fins 201 and the second fins 203. The detailed structures and intermediate structures are described above with respect to the fabrication processes.

Thus, in the disclosed fabrication methods of the semiconductor structure, a first oxidation process may be performed on the first fins in first region to turn the corners between the side surfaces and the top surfaces of the first fins into first rounded corners; and a second oxidation process may be performed on the second fins in second region to turn the corners between the side surfaces and the top surfaces of the second fins into second rounded corners. By controlling the first oxidation process, the radius of curvature of the first fins may be controlled. Thus, the first fins may match the requirements for the transistors formed in the first region. By controlling the second oxidation process, the radius of curvature of the second fins may be controlled. Thus, the second fins may match the requirements for the transistors formed in the second region. Thus, the requirements of the transistors for the radii of curvatures in the first region and the second region may be matched simultaneously.

Further, the width of the first fins in the first region may be smaller than the width of the fins in the second region; and the thickness of the first oxide layer may be smaller than the width of the second oxide layer. Thus, the width of the first fins may not be too small. Further, the electric field at the corners of the second fins may be relatively small. Thus, the break-down of the gate dielectric layer on the second fins may be prevented.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a semiconductor substrate having a first region and a second region and having a plurality of first fins in the first region and a plurality of second fins in the second region;
   performing a first oxidation process on the plurality of first fins to form a first oxide layer on surfaces of the plurality of first fins, wherein corners between top surfaces and side surfaces of the plurality of first fins form first rounded corners; and
   performing a second oxidation process on the plurality of second fins to form a second oxide layer on surfaces of the plurality of second fins, wherein corners between top surfaces and side surfaces of the second fins form second rounded corners,
   wherein a radius of curvature of the first rounded corner is different from a radius of curvature of the second rounded corner.

2. The method according to claim 1, wherein:
   a thickness of the first oxide layer is in a range of approximately 45 Å-55 Å; and a thickness of the second oxide layer is in a range of approximately 90 Å-110 Å.

3. The method according to claim 1, wherein:
a reaction gas of the second oxidation process includes oxygen;
a flow rate of the reaction gas is in a range of approximately 0.05 L/min-0.5 L/min; and
an oxidation time of the second oxidation process is in a range of approximately 2 hours-8 hours.

4. A method for fabricating a semiconductor structure, comprising:
providing a semiconductor substrate having a first region and a second region and having a plurality of first fins in the first region and a plurality of second fins in the second region;
performing a first oxidation process on the plurality of first fins to form a first oxide layer on surfaces of the plurality of first fins, wherein corners between top surfaces and side surfaces of the plurality of first fins form first rounded corners; and
performing a second oxidation process on the plurality of second fins to form a second oxide layer on surfaces of the plurality of second fins, wherein corners between top surfaces and side surfaces of the second fins form second rounded corners, wherein:
a width of the first fin is smaller than a width of the second fin; and
a radius of curvature of the first rounded corner is greater than a radius of curvature of the second rounded corner.

5. The method according to claim 4, wherein:
the width of the first fin is in a range of approximately 0.05 μm-0.07 μm; and
the width of the second fin is equal to, or greater than approximately 0.3 μm.

6. The method according to claim 4, wherein:
a thickness of the first oxide layer is in a range of approximately 45 Å-55 Å; and
a thickness of the second oxide layer is in a range of approximately 90 Å-110 Å.

7. The method according to claim 4, wherein:
a reaction gas of the second oxidation process includes oxygen;
a flow rate of the reaction gas is in a range of approximately 0.05 L/min-0.5 L/min; and
an oxidation time of the second oxidation process is in a range of approximately 2 hours-8 hours.

8. A method for fabricating a semiconductor structure, comprising:
providing a semiconductor substrate having a first region and a second region and having a plurality of first fins in the first region and a plurality of second fins in the second region;
performing a first oxidation process on the plurality of first fins to form a first oxide layer on surfaces of the plurality of first fins, wherein corners between top surfaces and side surfaces of the plurality of first fins form first rounded corners, wherein performing the first oxidation process on the plurality of first fins to form the first oxide layer comprises:
performing the first oxidation process to the plurality of first fins to form a first initial oxide layer on the surfaces of the first fins and the second fins; and
removing the first initial oxide layer in the second region to form the first oxide layer; and
performing a second oxidation process on the plurality of second fins to form a second oxide layer on surfaces of the plurality of second fins, wherein corners between top surfaces and side surfaces of the second fins form second rounded corners,
wherein a radius of curvature of the first rounded corner is different from a radius of curvature of the second rounded corner.

9. The method according to claim 8, wherein:
a reaction gas of the first oxidation process includes oxygen;
a flow rate of the reaction gas is in a range of approximately 0.05 L/min-0.5 L/min.; and
an oxidation time is in a range of approximately 2 hours-8 hours.

10. The method according to claim 8, wherein removing the first initial oxide layer in the second region comprises:
forming a first isolation layer to cover side surfaces of the plurality of first fins; and
etching the first initial oxide layer using the first isolation layer as a mask.

11. The method according to claim 10, wherein forming the first isolation layer comprises:
forming a first initial isolation layer to cover the side surfaces of the plurality of first fins and side surfaces of the plurality of second fins by one of a flowable chemical vapor deposition process and a plasma-enhanced chemical vapor deposition process; and
removing the first initial isolation layer in the second region.

12. The method according to claim 10, further comprising:
forming a mask layer on the first fins and the second fins; and
after forming the first isolation layer, performing the second oxidation process on the plurality of second fins.

13. The method according to claim 10, wherein:
the first isolation layer is made of silicon oxide.

14. The method according to claim 10, wherein:
the first isolation layer further covers top surfaces of the first fins.

15. The method according to claim 10, further comprising:
forming a second isolation layer covering side surfaces of the plurality of second fins in the second region.

16. The method according to claim 10, wherein forming the second isolation layer comprises:
forming a second initial isolation layer to cover the first isolation layer and the second fins in the second region by one of a high-density plasma chemical vapor deposition process and a flowable chemical vapor deposition process; and
removing the second initial isolation layer in the first region to provide the second isolation layer.

17. The method according to claim 15, further comprising:
etching the first isolation layer and the second isolation layer to form an isolation structure to expose portions of side surfaces of the plurality of first fins and portions of side surfaces of the plurality of second fins.

18. The method according to claim 17, after forming the isolation structure, further comprising:
forming a gate structure across the plurality of first fins and the plurality of second fins by covering portions of the top surfaces and side surfaces of the plurality of first fins and the plurality of second fins.

19. The method according to claim 8, wherein:
a thickness of the first oxide layer is in a range of approximately 45 Å-55 Å; and
a thickness of the second oxide layer is in a range of approximately 90 Å-110 Å.

20. The method according to claim 8, wherein:
a reaction gas of the second oxidation process includes oxygen;
a flow rate of the reaction gas is in a range of approximately 0.05 L/min-0.5 L/min; and
an oxidation time of the second oxidation process is in a range of approximately 2 hours-8 hours.

* * * * *